(12) United States Patent
Kim

(10) Patent No.: US 7,667,246 B2
(45) Date of Patent: Feb. 23, 2010

(54) FIELD PROGRAMMABLE GATE ARRAY (FPGA) MULTI-PARALLEL STRUCTURE

(75) Inventor: Kee Yong Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/644,835

(22) Filed: Dec. 26, 2006

(65) Prior Publication Data

US 2007/0152338 A1    Jul. 5, 2007

(30) Foreign Application Priority Data

Dec. 29, 2005   (KR) .................. 10-2005-0133103

(51) Int. Cl.
*H01L 29/80* (2006.01)
(52) U.S. Cl. ..................... 257/209; 438/197
(58) Field of Classification Search .......... 438/197, 438/587, 622, 982; 257/202, 208, 209, 211, 257/530, 758, E21.575, E21.592, E23.147, 257/529, E29.308, E29.68; 326/39, 41
See application file for complete search history.

(56) References Cited

U.S. PATENT DOCUMENTS

| 5,329,153 A * | 7/1994 | Dixit ........................... 257/530 |
| 2002/0050625 A1 * | 5/2002 | Cutter et al. ................ 257/530 |

* cited by examiner

*Primary Examiner*—Ha Tran T Nguyen
*Assistant Examiner*—Shaun Campbell
(74) *Attorney, Agent, or Firm*—Lowe Hauptman Ham & Berner, LLP

(57) ABSTRACT

A method of forming a field programmable gate array (FPGA) structure of a semiconductor device capable of reducing manufacturing cost through simpler processes includes forming a contact parallel connection structure in which contacts connected to a gate electrode and a source/drain by way of a first amorphous silicon pattern are connected in parallel with each other; forming a via parallel connection structure in which vias, connected to neighboring metal interconnections by a second amorphous silicon pattern, are connected in parallel with each other at a position not overlapping the contact parallel connection structure; and forming a connection means for connecting the contact parallel connection structure to the via parallel connection structure.

16 Claims, 5 Drawing Sheets

FIELD PROGRAMMABLE GATE ARRAY (FPGA) MULTI-PARALLEL STRUCTURE

CROSS-REFERENCE TO RELATED APPLICATIONS

The present invention claims priority of Korean Patent Application Number 10-2005-0133103, filed on Dec. 29, 2005, which is incorporated by reference in its entirety.

FIELD OF THE INVENTION

The present invention relates to a semiconductor fabrication technique, and more particularly, to a field programmable gate array (FPGA) structure having a multi-parallel structure and a method of forming the same.

BACKGROUND OF THE INVENTION

Typically, a via is used to connect a lower metal interconnection to an upper metal interconnection in forming multilayer metal interconnections.

FIGS. 1a and 1b are cross-sectional views illustrating a conventional method of forming a field programmable gate array (FPGA).

Referring to FIG. 1a, field oxide layers 12 are formed in a semiconductor substrate 11, and then a gate oxide layer 13, a gate electrode 14a and a spacer 14b are formed on the semiconductor substrate 11. A source/drain (not shown) is formed through ion implantation, and a silicide 15 is formed on the surface of the gate electrode 14a. Although not shown in FIG. 1a, the silicide 15 is also formed on the surface of the source/drain.

A pre metal dielectric (PMD) 16 is deposited on the obtained semiconductor substrate 11 and then a chemical mechanical polishing (CMP) process is performed.

The PMD 16 is then etched to form contact holes that open the surfaces of the gate electrodes 14a and the semiconductor substrate 11, and then the contact holes are buried with a metal material to form contacts 17. First metal interconnections M1 are formed which are connected to the contacts 17.

As shown in FIG. 1b, a first inter metal dielectric (IMD) 18a is deposited on the first metal interconnections M1 through a deposition process and is planarized through the CMP process.

First vias 19a connected to some of the first metal interconnections M1 are formed through a "Via1" patterning process. Further, second metal interconnections M2 connected to the first vias 19a are formed.

Then, a second IMD 18b, second vias 19b, and third metal interconnections M3 are sequentially formed, resulting in an FPGA.

However, a conventional FPGA process as shown in FIGS. 1a and 1b uses too many processes and masks, such as a metal interconnection mask and a via mask. This increases cost of manufacturing semiconductor devices.

SUMMARY OF THE INVENTION

It is, therefore, an object of the present invention to provide a field programmable gate array (FPGA) structure of a semiconductor device and a method of forming the same which are capable of reducing manufacturing cost through simpler processes.

In accordance with a preferred embodiment of the present invention, there is provided a field programmable gate array (FPGA) structure of a semiconductor device having a structure in which a plurality of gate electrode structures and sources/drains, a group of first metal interconnections, a group of second metal interconnections, and third metal interconnections are sequentially stacked with each insulating layer interposed therebetween. The structure includes one pair of contacts connecting one of the gate electrode structures and sources/drains to a pair of corresponding first metal interconnections in the group. The other pair of contacts connects the other gate electrode structures and sources/drains to the other pair of corresponding first metal interconnections in the group. A first structure pattern having voltage-dependent conductivity for connecting between the pair of contacts is provided. A pair of first vias connects the other pair of first metal interconnections to a pair of second corresponding metal interconnections. A second structure pattern having voltage-dependent conductivity connects the pair of first vias, and second vias are provided to connect the first and second structure patterns to a third metal interconnection.

In accordance with another preferred embodiment of the present invention, there is provided a method for forming an FPGA of a semiconductor device, the method including forming a contact parallel connection structure in which contacts connected to a gate electrode and a source/drain via a first amorphous silicon pattern are connected in parallel. The method includes forming a via parallel connection structure in which vias, connected to neighboring metal interconnections by a second amorphous silicon pattern, are connected in parallel with each other at a position not overlapping the contact parallel connection structure. The method further includes forming a connection means for connecting the contact parallel connection structure to the via parallel connection structure.

In accordance with still another preferred embodiment of the present invention, there is provided an FPGA structure of a semiconductor device having a structure in which a plurality of gate electrode structures and sources/drains, a group of first metal interconnections, and a group of second metal interconnections are sequentially stacked with each insulating layer interposed therebetween. The structure includes one pair of contacts connecting one of the gate electrode structures and sources/drains to a pair of corresponding first metal interconnections in the group. The other pair of contacts connects the other gate electrode structure and sources/drain to another pair of corresponding first metal interconnections in the group. A first structure pattern, having voltage-dependent conductivity, interconnects the pair of contacts. A pair of vias connects another pair of first metal interconnections to a pair of corresponding second metal interconnections, and a second structure pattern, having voltage-dependent conductivity, connects the pair of vias. Another via connects one of the pair of second metal interconnections to the first structure pattern.

In accordance with still another preferred embodiment of the present invention, there is provided an FPGA structure of a semiconductor device having a structure in which a plurality of gate electrode structures and sources/drains, a group of first metal interconnections, and a group of second metal interconnections sequentially stacked with each insulating layer interposed therebetween. The structure includes one pair of contacts for connecting a first gate electrode structure and source/drain to a pair of corresponding first metal interconnections in the group. The other pair of contacts connects a second gate electrode structure and sources/drain to another pair of corresponding first metal interconnections in the group. A structure pattern, having voltage-dependent conductivity, connects one contact connected to the first gate electrode structure to the other contact connected to the second gate electrode structure. A pair of vias is provided wherein one pair of vias connects the first metal interconnection, connected to the source/drain, to the structure pattern through a second metal interconnection. Another via connects the first metal interconnection, connected to the other source/drain, to the other second metal interconnection.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, preferred embodiments of the present invention will be described in detail with reference to the accompanying drawings so that they can be readily implemented by those skilled in the art.

The following embodiments are directed to techniques of using amorphous silicon in a field programmable gate array (FPGA). An amorphous silicon layer provides conductivity over a predetermined voltage and accordingly conductors connected to the amorphous silicon layer act if they are connected using a via or a metal interconnection. In the FPGA technique, a number of gate arrays are defined and ones of the gate arrays required for functions of a chip are selected by an end-user.

The First Embodiment

FIGS. 2a to 2d are flow charts illustrating a process of forming an FPGA on a substrate according to an embodiment of the present invention.

Figure 1A:
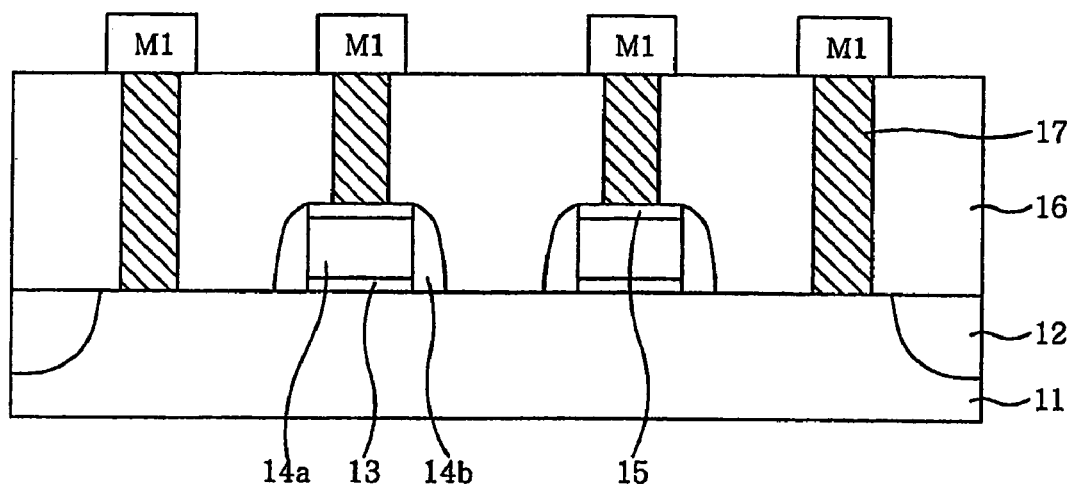
FIGS. 1a and 1b are cross-sectional views illustrating a conventional method of forming a field programmable gate array (FPGA)
Figure 1B:
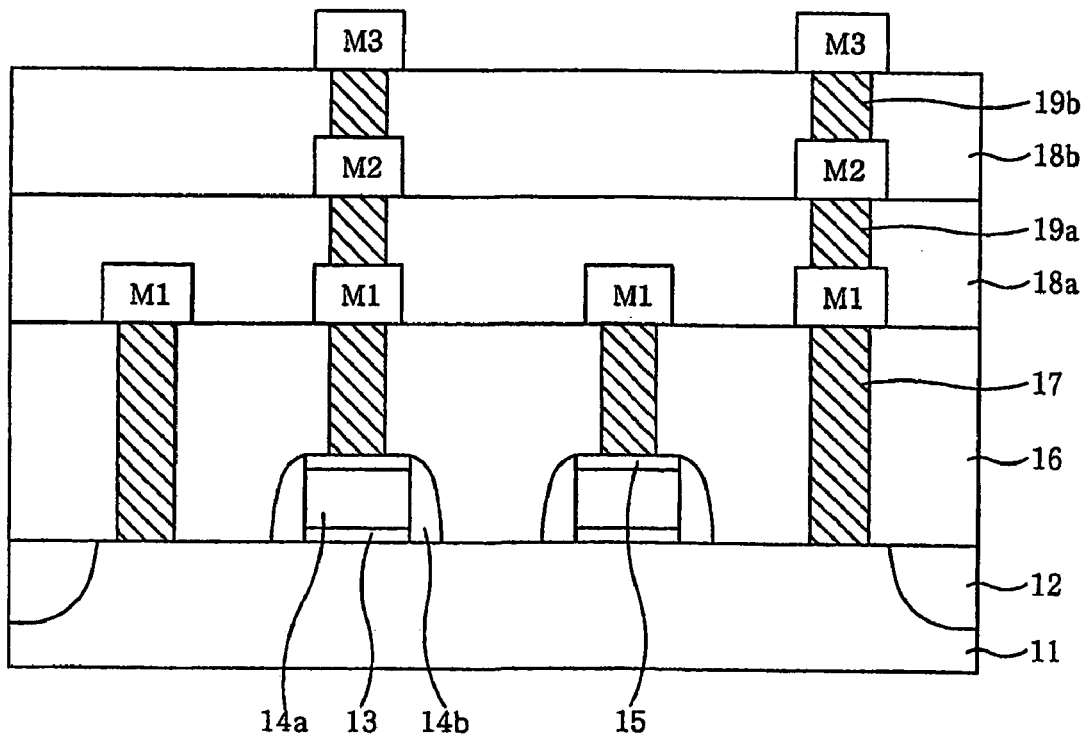
Figure 2A:
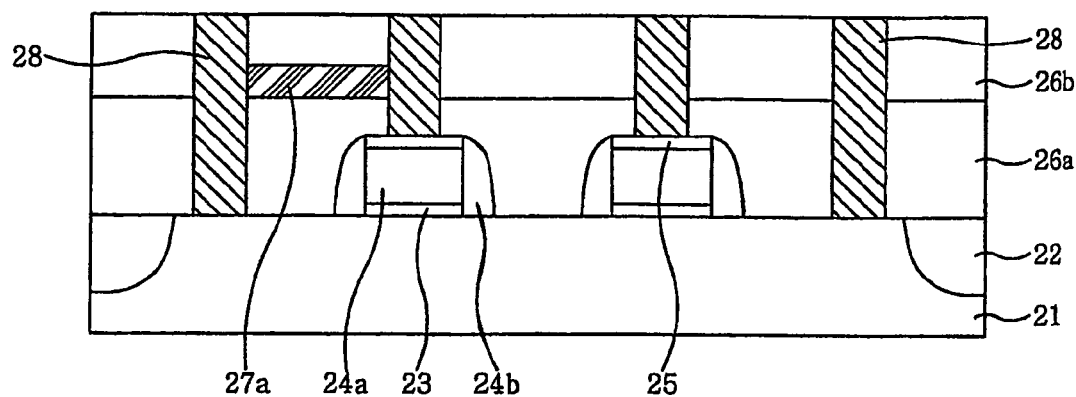
FIGS. 2a to 2d are flow charts illustrating a process of forming an FPGA on a substrate according to an embodiment of the present invention.

Referring to FIG. 2a, field oxide layers 22 are formed in a semiconductor substrate 21, and gate electrode structures include a gate oxide layer 23, a gate electrode 24a, and a spacer 24b formed at target positions. A source/drain (not shown) is formed through an ion implantation process in a predetermined position where the gate electrode structures are not formed. In addition, a silicide 25 is formed on the gate electrode 24a and the source/drain. A series of processes of forming the gate electrode structure, the source/drain, and the silicide on the semiconductor substrate 21 are well known in the art and thus a detailed description thereof will be omitted herein for the simplicity of the specification.

Subsequently, a first pre metal dielectric (PMD) layer 26a is deposited on the semiconductor substrate 21 through a deposition process to fully bury the gate electrode structures and then is planarized through a PMD CMP process.

Further, a first amorphous silicon layer is deposited on the first planarized PMD 26a through a deposition process and then a first amorphous silicon pattern 27a is formed through a selective etching (patterning) process using an etch mask (not shown). The first amorphous silicon pattern 27a is formed in such a size that both ends thereof at least reach contacts to be formed on the neighboring source/drain and the gate electrode structure through a subsequent process. The first amorphous silicon pattern 27a has such a thickness that it operates at a proper voltage. The first amorphous silicon layer may be deposited, for example, through a low pressure chemical vapor deposition (LPCVD) process or an atmosphere pressure CVD (APCVD) process.

A second PMD 26b is then deposited at a target position on the first PMD 26a having the first amorphous silicon pattern 27a through a deposition process and is planarized through an IMD CMP process.

The second PMD 26b and the first PMD 26a on the source/drain are then partially removed through a selective etching process ("Via1 process") using an etch mask (not shown) in order to form contact holes that open (expose) surfaces of the source/drain and the gate electrode structure. In forming the contact holes, the PMDs are etched with the first amorphous silicon pattern 27a interposed therebetween so that the both sides of the first amorphous silicon pattern 27a are exposed to the contact hole.

Further, a thick metal material is deposited on the entire surface of the substrate to fully bury the contact holes, and the metal material on the second PMD 26b is selectively removed through an entire-surface planarizing and etching process such as a CMP process to form contacts 28 formed by filling the contact holes with a metal material. The first amorphous silicon pattern 27a connects the contact formed on the source/drain with the contact formed on the gate electrode structure. That is, the first amorphous silicon pattern 27a serves to connect the neighboring contacts 28 in parallel with each other. This structure is called a "contact parallel structure."

Figure 2B:
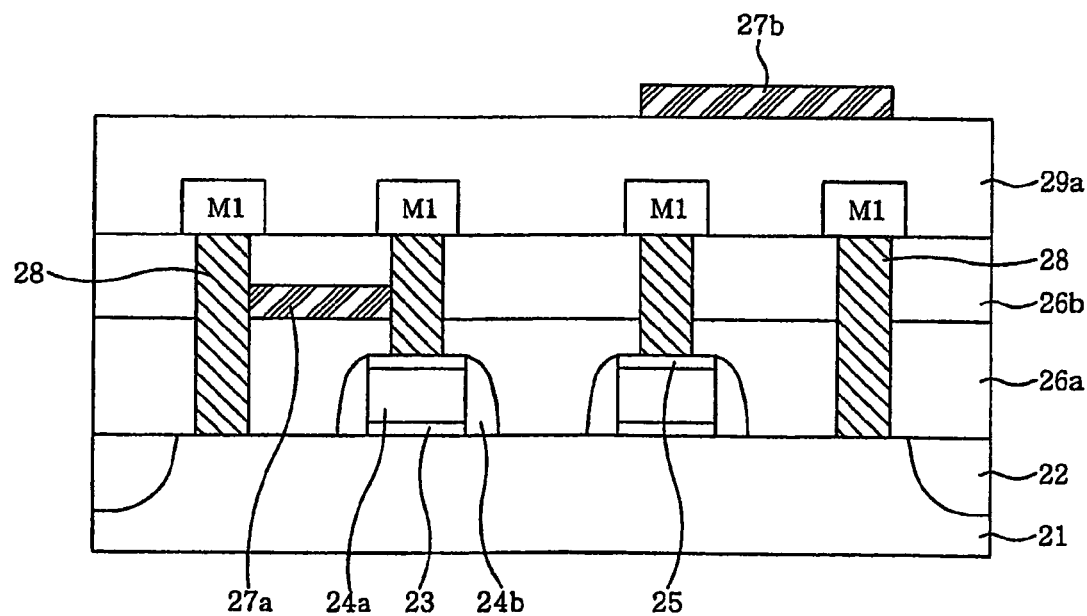
Figure 2C:
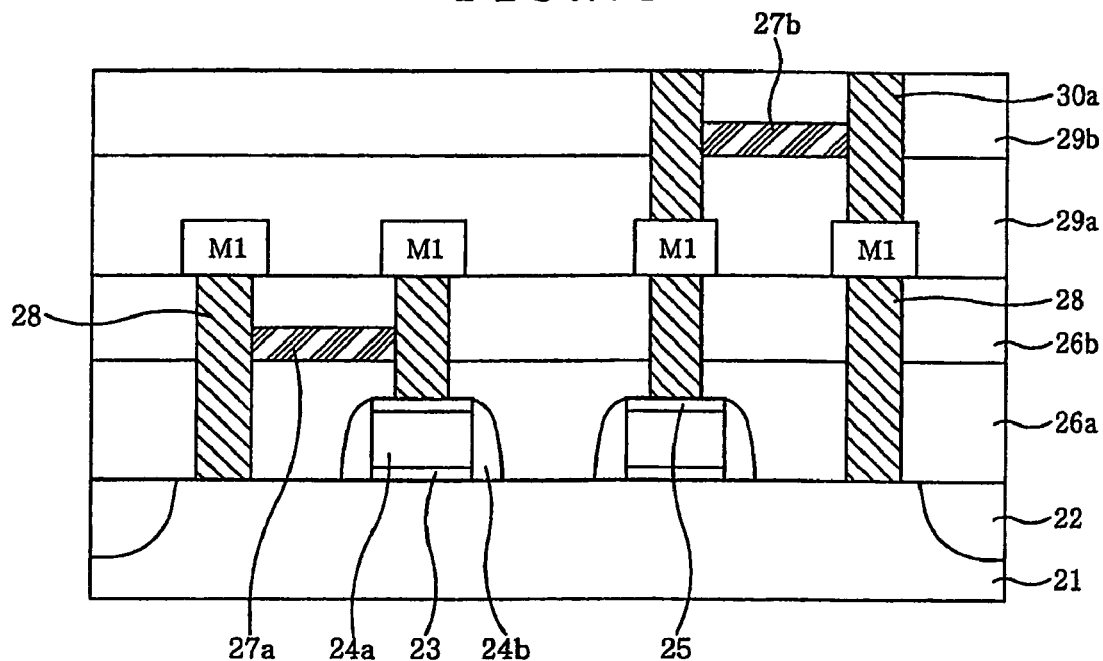

Referring to FIG. 2b, a group of first metal interconnections M1 is formed which are connected to the contacts 28, and a first thick inter metal dielectric (IMD) 29a is deposited to fully bury the group of the first metal interconnections M1 and then planarized through a CMP process.

Further, a second amorphous silicon layer is deposited on the first planarized IMD 29a through a deposition process and then a second amorphous silicon pattern 27b is formed through a patterning process. Here, the second amorphous silicon pattern 27b is formed in such a size that both ends thereof at least reach via holes to be formed on the first neighboring metal interconnection M1 through a subsequent process (see FIG. 2C). The second amorphous silicon pattern 27b has such a thickness that it operates at a proper voltage. The second amorphous silicon layer may be deposited, for example, through a low pressure chemical vapor deposition (LPCVD) process or an atmosphere pressure CVD (APCVD) process.

In addition, the second amorphous silicon pattern 27b is deposited to a greater thickness than that of the first amorphous silicon pattern 27a, and is formed in portions excluding the portion where the first amorphous silicon pattern 27a is formed, when viewed in plan from above. That is, the first amorphous silicon pattern 27a and the second amorphous silicon pattern 27b are formed in such positions that they do not vertically overlap each other.

Subsequently, a second IMD 29b is deposited at a target position on the first IMD 29, which includes the second amorphous silicon pattern 27b, through a deposition process and is then planarized through an IMD CMP.

The second IMD 29b and the first IMD 29a on the first metal interconnections M1 are then selectively removed through a selective etching process ("Via1 process") using an etch mask (not shown) in order to form first via holes that open (expose) surfaces of the two neighboring metal interconnections M1 that are to be connected to the second amorphous silicon pattern 27b. In forming the first via holes, the IMDs are etched with the second amorphous silicon pattern 27b interposed therebetween so that both sides of the second amorphous silicon pattern 27b are exposed to the first via holes.

Further, a thick metal material is deposited on the entire surface of the substrate to fully bury the first via holes. First vias 30a, formed by filling the first via holes with a metal material, are further formed using an entire-surface planarizing and etching process, such as a CMP process.

Accordingly, the second amorphous silicon pattern 27b is simultaneously connected to the first neighboring metal interconnections M1 via the first vias 30a, thereby forming a parallel structure. In this case, one of the first neighboring metal interconnections M1 is connected to the semiconductor substrate, the other metal interconnection M1 is connected to the gate electrode. In this manner, the second amorphous silicon pattern 27b serves to connect the gate electrode structure to the semiconductor substrate 21. As a result, the second amorphous silicon pattern 27b connects the first neighboring parallel vias 30a (rightmost two vias in FIG. 2C). This structure is called a first via parallel structure.

Figure 2D:
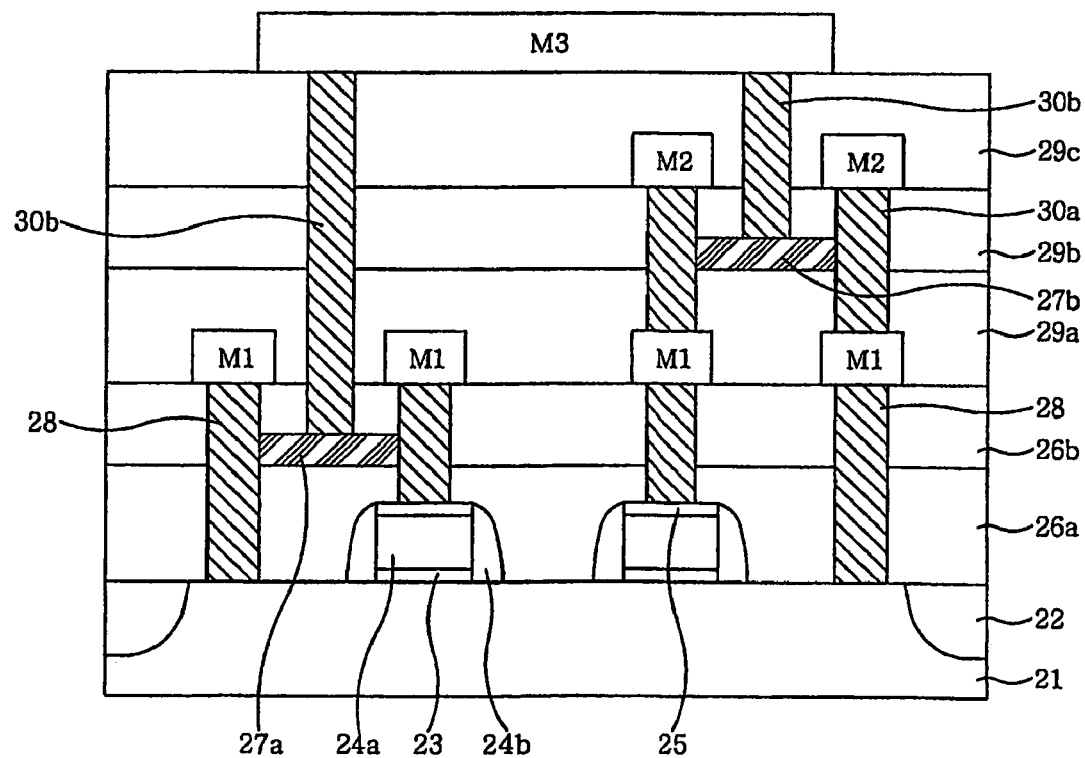

Referring to FIG. 2d, a third IMD 29c is deposited through a deposition process at a target position on the second IMD 29b that includes the first vias 30a. The third IMD 29c is then planarized through an IMD CMP process.

The third IMD 29c and the second IMD 29b at one side (right side of FIG. 2D) and the third IMD 29c, the second IMD 29b, the first IMD 29a and the second PMD 26b at the other side (left side of FIG. 2D) are sequentially removed through a selective etching process ("Via2 process") using an etch mask (not shown) in order to form second via holes that open (expose) the surfaces of the second amorphous silicon pattern 27b and the first amorphous silicon pattern 27a.

A thick metal material is formed to fully bury the second via holes and the metal material on the third IMD 29c. A portion of the metal material is selectively removed through an entire-surface etching process, such as a CMP process, in order to form second vias 30b formed by filling the second via holes with a metal material. A third metal interconnection M3 is then formed that is connected to the second vias 30b.

Accordingly, the first amorphous silicon pattern 27a and the second amorphous silicon pattern 27b are connected to each other via the second vias 30b and the third metal interconnection M3. As a result, an FPGA having the contact parallel structure using the first amorphous silicon pattern 27a and the first via parallel structure using the second amorphous silicon pattern 27b is implemented in which a voltage is applied to the third metal interconnection M3. A voltage is selectively applied to the first amorphous silicon pattern 27a that is different than a voltage applied to the second amorphous silicon pattern 27b.

Thus, in the FPGA structure of the semiconductor device according to an embodiment of the present embodiment, the use of the two amorphous silicon patterns (with voltage-dependent conductivity), having different thicknesses, enables the first metal interconnection and the gate electrode to be selectively used by one applied voltage (on the third metal interconnection).

The Second Embodiment

Figure 3:
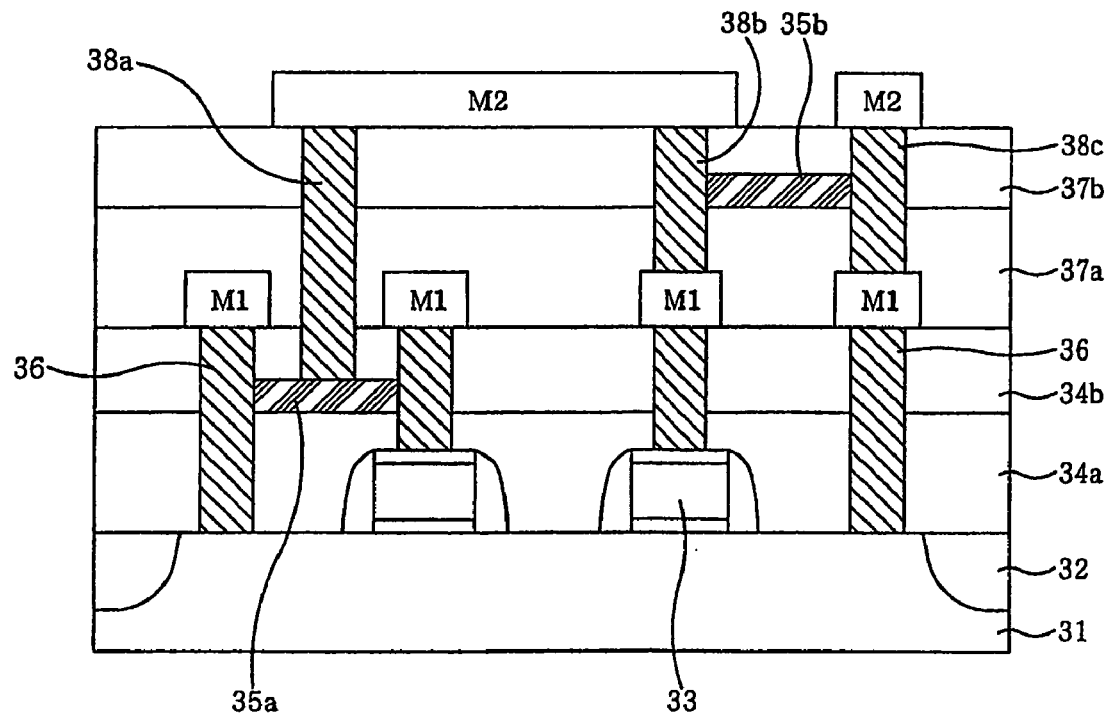
FIG. 3 is a cross-sectional view illustrating an FPGA structure having a multi-parallel structure according to another embodiment of the present invention.

FIG. 3 is a cross-sectional view illustrating an FPGA structure having a multi-parallel structure according to another embodiment of the present invention.

Referring to FIG. 3, an FPGA of a semiconductor device according to an embodiment of the present embodiment has a structure in which one pair of contacts 36 connect one gate electrode and source/drain to a pair of corresponding first metal interconnections in a group (left side of FIG. 3). Another pair of contacts connect the other gate electrode and source/drain to the other pair of corresponding first metal interconnections in the group (right side of FIG. 3). A first structure pattern 35a, having voltage-dependent conductivity (a first amorphous silicon pattern), interconnects the pair of contacts (on the left side of FIG. 3). A pair of vias 38b and 38c connect the other pair of the first metal interconnections M1 (on the right side of FIG. 3) to a pair of the second corresponding metal interconnections M2. A second structure pattern 35b, having voltage-dependent conductivity (a second amorphous silicon pattern), connects the pair of the vias 38b and 38c. Another via 38a (on the left side of FIG. 3) connects one of the pair of the second metal interconnections M2 to the first structure pattern 35a.

Specifically, in the FPGA of the present embodiment, gate electrode structures 33, each including a gate oxide layer, a gate electrode, and a silicide, and sources/drains (not shown), are formed on a semiconductor substrate 31 having field oxide layers 32 formed therein. A first PMD 34a and a second PMD 34b are sequentially stacked and planarized to fully bury the gate electrode structure 33.

A series of processes forming the field oxide layers 32, the gate electrode structures 33, the first PMD 34a, and the second PMD 34b on the semiconductor substrate 31 are substantially the same as in the first embodiment, described above, and thus a detailed description thereof will be omitted herein for the simplicity of the specification.

Further, a group of first metal interconnections M1 is formed on the second PMD 34b, each pair of the first metal interconnections M1 are connected to the corresponding gate electrode structure 33 and source/drain by a pair of corresponding contacts 36. The other pair of first metal interconnections M1 (right side of FIG. 3) is connected to the other gate electrode structure 33 and source/drain by the other pair of contacts 36. A series of processes of forming the group of the first metal interconnections M1 and the contacts 36 are the same as in the first embodiment, and thus a detailed description thereof is omitted herein.

Then, first and second IMDs 37a and 37b are sequentially formed on the second PMD 34b that includes the group of first metal interconnections M1. Two second metal interconnections M2 are formed to be spaced apart from each other on the second IMD 37b. The second metal interconnection M2, having a relatively greater area, is connected to the first amorphous silicon pattern 35a and to the first metal interconnection M1 (connected, by the contact, to the gate electrode structure which is not connected to the first amorphous silicon pattern 35a) by way of the pair of vias 38a and 38b. The second metal interconnection M2, having a relatively smaller area, is connected to the first other metal interconnection M1 (connected to the source/drain that is not connected to the first amorphous silicon pattern 35a) by way of the other via 38c.

In this manner, the FPGA of the present embodiment has a structure in which a pair of vias 38a and 38b, connected to one of the second metal interconnections M2, connects a first amorphous silicon pattern 35a, which interconnects a pair of gate electrode structures 33 and source/drain, to a neighboring gate electrode structure 33. Another via 38c connects the drain/source associated with the neighboring gate electrode structure to via 38b by way of the second amorphous silicon pattern 35b.

In this case, the second amorphous silicon pattern 35b may have a thickness greater than or the same as the first amorphous silicon pattern 35a depending on a need or usage. A different voltage may be applied to the first amorphous silicon pattern 35A and the second amorphous silicon pattern 35B, similar with the first embodiment described above.

It will be easily appreciated that the first and second IMDs 37a and 37b, the second amorphous silicon pattern 35b, the vias 38a, 38b, and 38c, and the second metal interconnections M2 may be formed by selectively applying the processes of the first embodiment, and thus a detailed description thereof will be omitted herein.

Thus, the FPGA according to the present embodiment is somewhat different in the stacked structure from the first embodiment described above, but the use of the amorphous silicon having voltage-dependent conductivity enables the first metal interconnection and the gate electrode to be selectively used by one voltage (e.g., on the second metal interconnection), which is the same effect as in the first embodiment.

The Third Embodiment

Figure 4A:
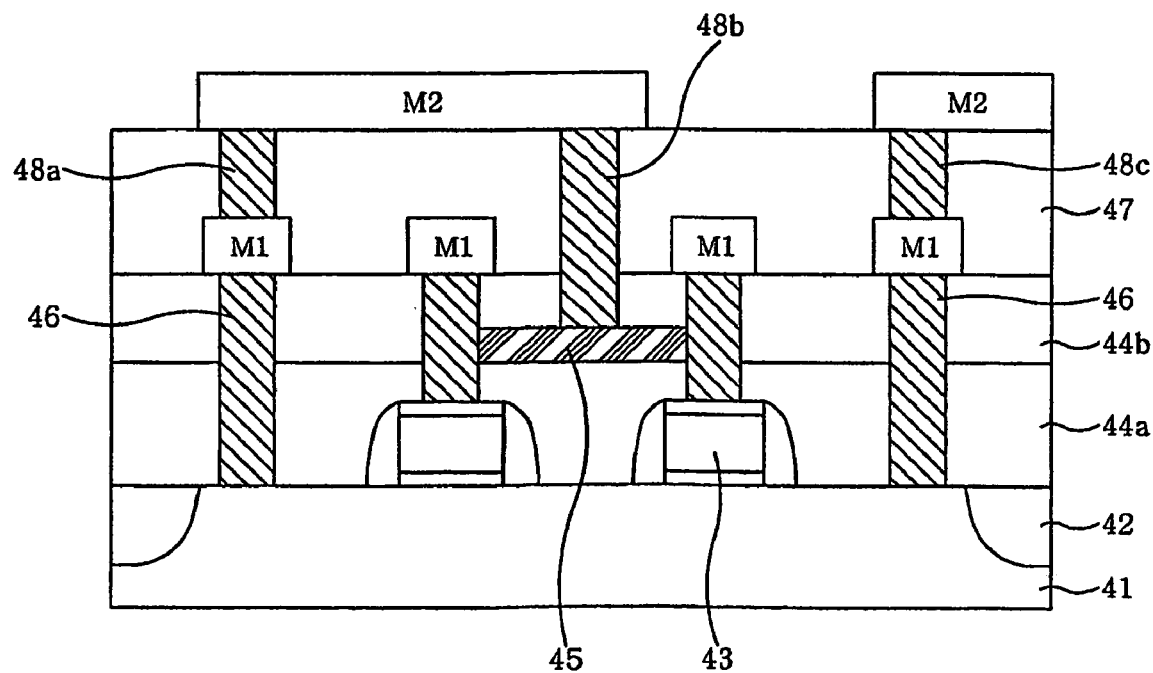
FIG. 4a is a cross-sectional view illustrating an FPGA structure having a multi-parallel structure according to still another embodiment of the present invention.

FIG. 4a is a cross-sectional view illustrating an FPGA structure having a multi-parallel structure according to still another embodiment of the present invention.

Referring to FIG. 4a, an FPGA of a semiconductor device according to the present embodiment has a structure in which one pair of contacts connect one gate electrode and source/drain to a pair of corresponding ones of the first metal interconnections in a group. The other pair of contacts connect the other gate electrode and source/drain to the other pair of corresponding first metal interconnections in the group. A structure pattern having voltage-dependent conductivity (amorphous silicon pattern) connects the one gate electrode structure connected to one contact and the other gate electrode structure connected to the other contact. Vias 48a and 48b comprise a pair of vias that connect the first metal interconnection M1, which connects to the source/drain, to the structure pattern 45 by way of a second metal interconnection M2. A via 48c connects the first metal interconnection M1, connected to the other source/drain, to the second other metal interconnection M2.

Specifically, in the FPGA of the present embodiment, gate electrode structures 43 each including a gate oxide layer, a gate electrode, and a silicide, and sources/drains (not shown) are formed on a semiconductor substrate 41 having field oxide layers 42 formed therein. A first PMD 44a and a second PMD 44b are sequentially stacked and planarized to fully bury the gate electrode structures 43.

Further, a group of first metal interconnections M1 is formed on the second PMD 44b, an amorphous silicon pattern 45 is formed between the neighboring contacts 46 connecting the first metal interconnections M1 corresponding to the gate electrode structure 43, and preferably located on the first PMD 44a.

A thick IMD 47 is then formed to fully bury the group of first metal interconnections M1, and a group of second metal interconnections M2 is formed on the IMD 47. The second metal interconnection M2 having a relatively greater area is connected to the amorphous silicon pattern 45 and the first metal interconnection M1 via a pair of vias, 48a and 48b, and the second metal interconnection M2 having a relatively smaller area is connected to the first other metal interconnection M1 via the via 48c. That is, the FPGA of the present embodiment has a structure in which the contacts 46 connected to the neighboring gate electrode structure 43 are connected to the second metal interconnection M2 in common by way of the amorphous silicon pattern 45.

Here, the FPGA structure of the semiconductor device according to the present embodiment may be formed using a series of known processes as in the above-described embodiments, and thus a detailed description thereof is omitted to avoid overlapping description for the simplicity of the specification.

Figure 4B:
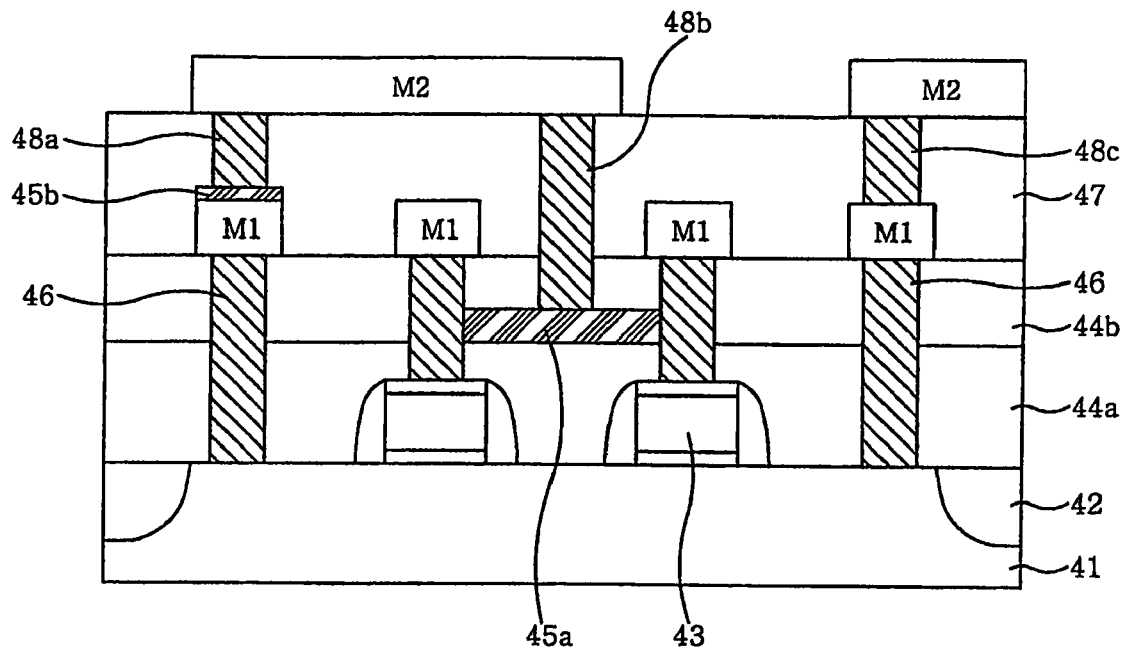
FIG. 4b is a cross-sectional view illustrating an FPGA structure having a multi-parallel structure according to one variant of still another embodiment of the present invention.

For example, the FPGA of the present embodiment may be formed in a structure depicted in FIG. 4B, in which amorphous silicon pattern 45b is formed between via 48a and the first metal interconnection M1, i.e., on the first metal interconnection M1, as shown in FIG. 4b.

It will be easily appreciated that the other amorphous silicon pattern 45b may be formed to a thickness greater than or the same as that of the amorphous silicon pattern 45a depending on a need or usage, and a different voltage may be applied to the patterns.

Figure 4C:
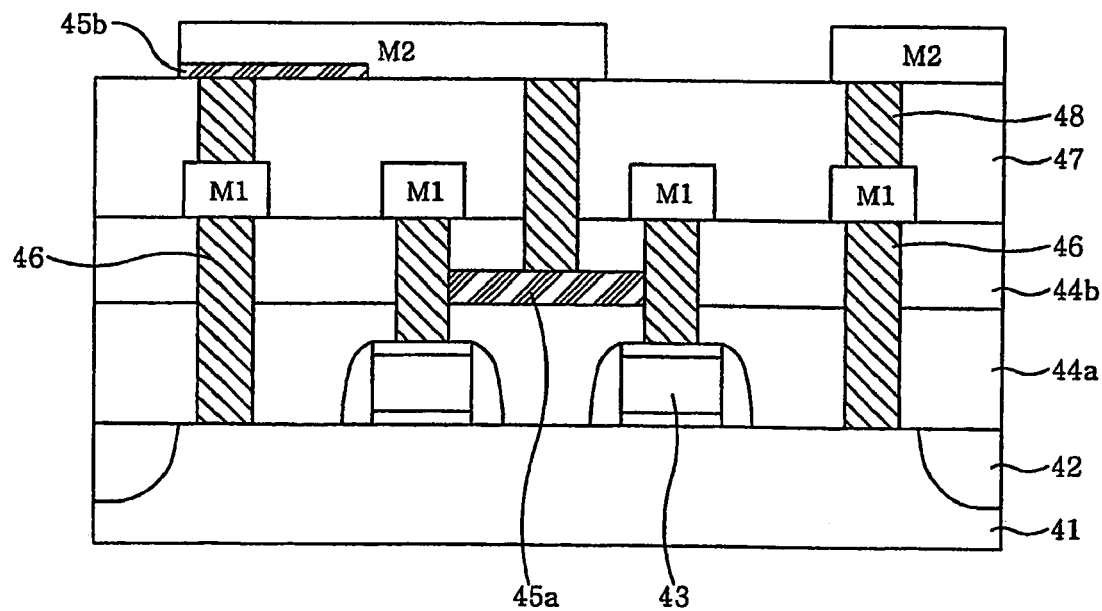
FIG. 4c is a cross-sectional view illustrating an FPGA structure having a multi-parallel structure according to another variant of still another embodiment of the present invention.

For example, the FPGA of the present embodiment may also be formed in a structure in which the other amorphous silicon pattern 45b is formed between one via 48 of a pair of vias that connect the amorphous silicon pattern 45a and the first metal interconnection M1 to the second metal interconnection M2, and the second metal interconnection M2, i.e., on the via 48, as shown in FIG. 4c.

It will be easily appreciated that the other amorphous silicon pattern 45b may be formed to a thickness greater than or the same as that of the amorphous silicon pattern 45a depending on a need or usage, and a different voltage may be applied to the patterns, as in FIG. 4b.

Thus, the FPGA according to the present embodiment is somewhat different in the stacked structure from the first and second embodiments described above, but the use of the amorphous silicon having voltage-dependent conductivity enables the first metal interconnection and the gate electrode to be selectively used by one voltage (e.g., on the second metal interconnection), which is the same effect as in the first and second embodiments described above.

According to the present invention described above, the use of two amorphous silicon patterns having a different thickness enables the first metal interconnection and the gate electrode to be selectively used by one voltage. That is, an operation in a design can be effectively implemented with one amorphous silicon pattern.

In addition, a manufacturing process can be simplified and manufacture cost can be reduced because the upper and lower metals are connected to each other by the first via Via1 before the second metal interconnection M2 is patterned.

While the invention has been shown and described with respect to the preferred embodiments, it will be understood by those skilled in the art that various changes and modifications may be made without departing from the spirit and scope of the invention as defined in the following claims.

What is claimed is:

1. A field programmable gate array (FPGA) structure of a semiconductor device includes a structure in which a plurality of gate electrode structures and sources/drains, a first group of first metal interconnections, a second group of second metal interconnections, and at least a third metal interconnection are sequentially stacked with insulating layers interposed therebetween, the structure comprising:

one pair of contacts connecting one gate electrode structure and source/drain to a pair of corresponding first metal interconnections in the first group;

another pair of contacts connecting another gate electrode structure and source/drain to an other pair of corresponding first metal interconnections in the first group;

a first structure pattern having voltage-dependent conductivity interconnecting said one pair of contacts, said first structure pattern conducts each time a first predetermined voltage is applied to said first structure pattern;

a pair of first vias connecting the other pair of corresponding first metal interconnections in the first group to a pair of corresponding second metal interconnections;

a second structure pattern comprising voltage-dependent conductivity interconnecting the pair of the first vias, the second structure pattern conducts each time a second predetermined voltage is applied to said second structure pattern; and second vias connecting the first and second structure patterns to the at least a third metal interconnection.

2. The structure of claim 1, wherein each of the first and second structure patterns is an amorphous silicon pattern.

3. The structure of claim 1, wherein the second structure pattern has a thickness greater than a thickness of the first structure pattern.

4. The structure of claim 3, wherein the first voltage applied to the first structure pattern is different than the second voltage applied to the second structure pattern.

5. An FPGA structure of a semiconductor device includes a structure in which a plurality of gate electrode structures and sources/drains, a first group of first metal interconnections, and a second group of second metal interconnections are sequentially stacked with insulating layers interposed therebetween, the structure comprising:

one pair of contacts connecting one of the gate electrode structures and sources/drains to a pair of corresponding first metal interconnections in the first group;

an other pair of contacts connecting an other of the gate electrode structures and sources/drains to an other pair of corresponding first metal interconnections in the first group;

a first structure pattern comprising voltage-dependent conductivity interconnecting the first pair of contacts, the first structure pattern conducts each time a predetermined first voltage is applied to the first structure pattern;

a pair of vias connecting the other pair of the first metal interconnections to a pair of the second metal interconnections;

a via connecting one of the pair of the second metal interconnections to the first structure pattern; and a second structure pattern comprising voltage-dependent conductivity interconnecting the pair of the vias, the second structure pattern conducts each time a predetermined second voltage is applied to the second structure pattern.

6. The structure of claim 5, wherein each of the first and second structure patterns is an amorphous silicon pattern.

7. The structure of claim 5, wherein the second structure pattern has a thickness greater than a thickness of the first structure pattern.

8. The structure of claim 7, wherein the first voltage applied to the first structure pattern is different than the second voltage applied to the second structure pattern.

9. The structure of claim 5, wherein the first structure pattern and the second structure pattern has a common thickness.

10. An FPGA structure of a semiconductor device includes a structure in which a plurality of gate electrode structures and sources/drains, a group of first metal interconnections, and a group of second metal interconnections sequentially stacked with an insulating layer interposed therebetween, the structure comprising:

one pair of contacts connecting one of the gate electrode structures and source/drains to a pair of corresponding first metal interconnections in a first group;

an other pair of contacts connecting an other of the gate electrode structures and sources/drains to an other pair of corresponding first metal interconnections in the first group;

a first structure pattern, having voltage-dependent conductivity, connecting one contact, which is connected to the gate electrode structure, to the other contact that is connected to the other gate electrode structure, the first structure pattern conducts each time a first predetermined voltage is applied to the first structure pattern;

a pair of vias connecting the first metal interconnection that is connected to the source/drain and the structure pattern, to a second metal interconnection; and a via connecting the first metal interconnection that is connected to the other source/drain, to the second metal interconnection.

11. The structure of claim 10, further comprising a second structure pattern formed between one of the pair of vias and the first corresponding metal interconnection.

12. The structure of claim 10, further comprising a second structure pattern formed between one of the pair of vias and the second metal interconnections corresponding thereto, the second structure pattern conducts each time a second predetermined voltage is applied to the second structure pattern.

13. The structure of claim 11, wherein each structure pattern is an amorphous silicon pattern.

14. The structure of claim 11, wherein the second structure pattern has a thickness greater than a thickness of the first structure pattern.

15. The structure of claim 14, wherein the first voltage applied to the first structure pattern is different from the second voltage applied to the second structure pattern.

16. The structure of claim 11, wherein the first structure pattern and the second structure pattern has a common thickness.

* * * * *